(12) United States Patent
Takayama et al.

(10) Patent No.: US 7,589,777 B2
(45) Date of Patent: Sep. 15, 2009

(54) SOLID-STATE IMAGING DEVICE WITH LIGHT SHIELD ELECTRICALLY CONNECTED TO INTER-HORIZONTAL TRANSFER REGISTER

(75) Inventors: Masaaki Takayama, Fukuoka (JP); Hiroaki Tanaka, Fukuoka (JP)

(73) Assignee: Sony Corporation, Tokyo (JP)

( * ) Notice: Subject to any disclaimer, the term of this patent is extended or adjusted under 35 U.S.C. 154(b) by 412 days.

(21) Appl. No.: 11/609,074

(22) Filed: Dec. 11, 2006

(65) Prior Publication Data
US 2007/0132871 A1  Jun. 14, 2007

(30) Foreign Application Priority Data
Dec. 14, 2005  (JP)  ............ P2005-360857

(51) Int. Cl.
H04N 3/14 (2006.01)
H04N 5/335 (2006.01)
H01L 31/062 (2006.01)

(52) U.S. Cl. .................. 348/323; 348/321; 257/294

(58) Field of Classification Search .......... 348/311, 348/313, 321, 323, 319; 257/294
See application file for complete search history.

(56) References Cited

U.S. PATENT DOCUMENTS 5,387,935 A * 2/1995 Kobayashi ........... 348/323
5,812,192 A * 9/1998 Ishigami et al. ....... 348/321
6,618,087 B1 * 9/2003 Hokari et al. ......... 348/311
7,301,184 B2 * 11/2007 Kawasaki ............. 257/249

FOREIGN PATENT DOCUMENTS

| JP | 06105238 A * | 4/1994 |
| JP | 09-069620 | 3/1997 |
| JP | 2000022124 A * | 1/2000 |
| JP | 2003243645 A * | 8/2003 |

* cited by examiner

Primary Examiner—John M Villecco
(74) Attorney, Agent, or Firm—Sonnenschein Nath & Rosenthal LLP (57) ABSTRACT

A solid-state imaging device includes an imaging part, a first horizontal charge-transfer part and a second horizontal charge-transfer part that transfer charges transferred from the imaging part in a horizontal direction, an inter-horizontal charge-transfer part transfer electrode that applies a voltage to a transfer channel area provided between the first horizontal charge-transfer part and the second horizontal charge-transfer part, and a first light-shielding film that is provided over the first horizontal charge-transfer part and the second horizontal charge-transfer part and is made of a conductive material, and the inter-horizontal charge-transfer part transfer electrode and the first light-shielding film are electrically connected to each other.

4 Claims, 8 Drawing Sheets

PRIOR ART

SOLID-STATE IMAGING DEVICE WITH LIGHT SHIELD ELECTRICALLY CONNECTED TO INTER-HORIZONTAL TRANSFER REGISTER

CROSS REFERENCES TO RELATED APPLICATIONS

The present invention contains subject matter related to Japanese Patent Application JP 2005-360857 filed in the Japanese Patent Office on Dec. 14, 2005, the entire contents of which being incorporated herein by reference.

BACKGROUND OF THE INVENTION

1. Field of the Invention

The present invention relates to a solid-state imaging device, and particularly to a solid-state imaging device including plural horizontal charge-transfer parts.

2. Background Art

In order to meet a demand for high resolution and high performance of a digital still camera, the development for increasing the number of pixels of a solid-state imaging device and for improving various imaging characteristics has been progressed. Recently, a solid-state imaging device intended to achieve high resolution and including plural horizontal charge-transfer parts has been developed, and has been put to practical use (see, for example, JP-A-9-69620 (patent document 1)).

Figure 6:
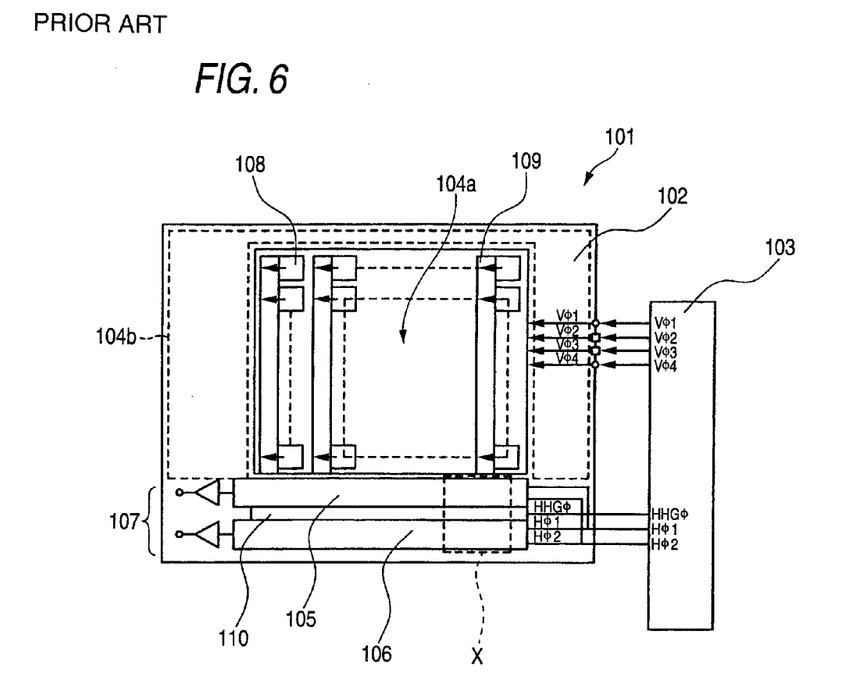
FIG. 6 is a schematic view for explaining a solid-state imaging device in related art.

FIG. 6 is a schematic view for explaining a solid-state imaging device including two horizontal charge-transfer parts, and a solid-state imaging device 101 shown here includes a CCD solid-state imaging element 102 and a timing signal generation circuit 103. The CCD solid-state imaging device roughly includes an imaging part 104a, an optical black area 104b, a first horizontal charge-transfer part 105, a second horizontal charge-transfer part 106, and an output part 107.

Besides, the imaging part includes light receiving parts 108 arranged in a matrix form, and a vertical charge-transfer part 109 provided for each of vertical columns of the light receiving parts and transferring a charge from each of the light receiving parts. An inter-horizontal charge-transfer part transfer electrode (hereinafter referred to as "H-H transfer electrode") 110 is provided between the first horizontal charge-transfer part and the second horizontal charge-transfer part.

Figure 7:
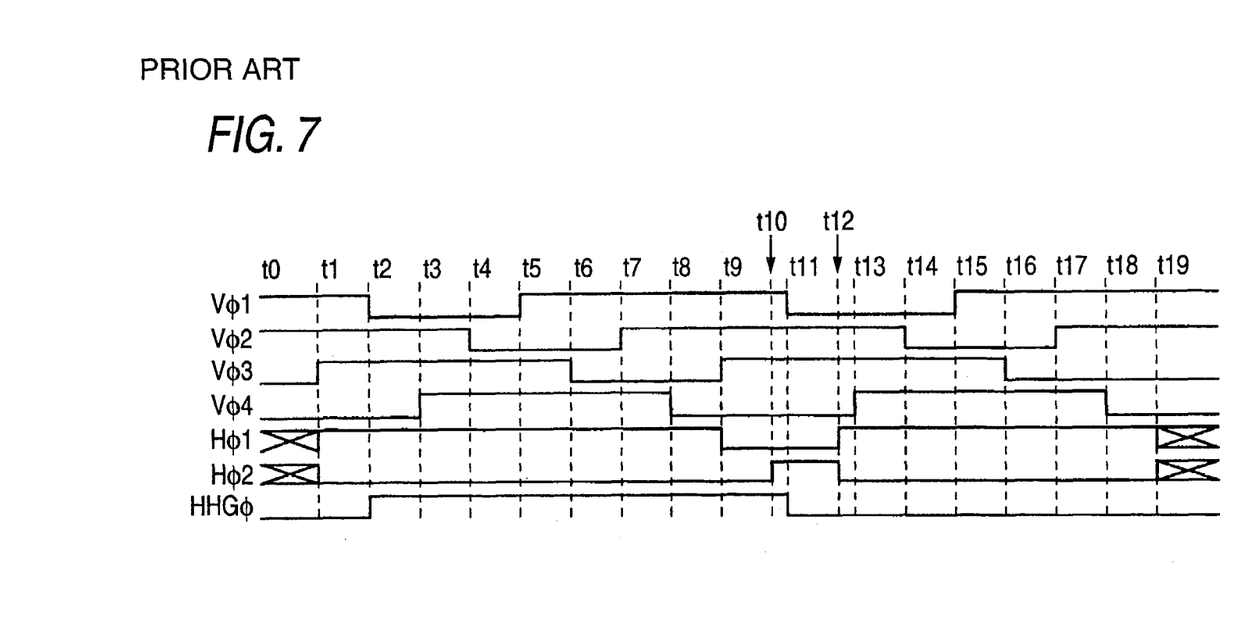
FIG. 7 is a timing chart of respective signals outputted from a timing signal generation circuit.

In the solid-state imaging device constructed as stated above, vertical transfer clocks Vφ1, Vφ2, Vφ3 and Vφ4 are applied to the vertical charge-transfer parts at timings shown in FIG. 7 from the timing signal generation circuit, so that charges read from the light receiving parts into the vertical charge-transfer parts are transferred in the vertical direction. Horizontal clocks Hφ1 and Hφ2 are applied to the first horizontal charge-transfer part and the second horizontal charge-transfer part at timings shown in FIG. 7 from the timing signal generation circuit, so that charges are sequentially horizontally transferred from the first horizontal charge-transfer part and the second horizontal charge-transfer part to the output part and are outputted from the output part.

Here, in order to horizontally transfer the charges from the second horizontal charge-transfer part to the output part and to output them from the output part, it is necessary to perform transfer (hereinafter referred to as "H-H transfer") of charges between the first horizontal charge-transfer part and the second horizontal charge-transfer part.

Hereinafter, a structure to realize the H-H transfer will be described with reference to the drawings.

Figure 8A:
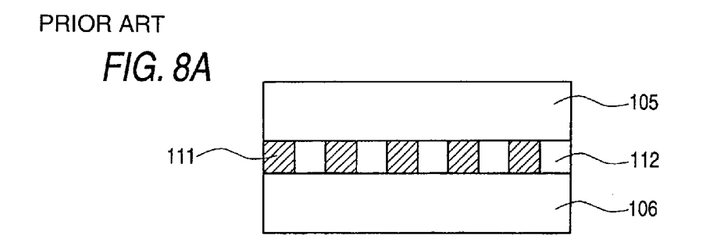
FIGS. 8A to 8D are explanatory views of a structure for realizing H-H transfer.
Figure 8B:
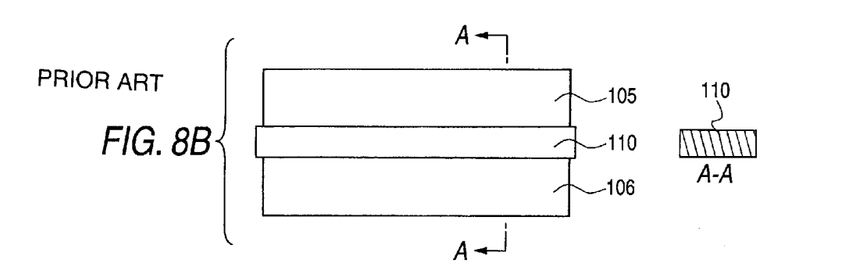

That is, in order to realize the H-H transfer, first, ion implantation is performed between the first horizontal charge-transfer part and the second horizontal charge-transfer part, and as shown in FIG. 8A, which is a partial enlarged sectional view of an area indicated by character X in FIG. 6, after transfer channel areas 111 and channel stop areas 112 are formed, the H-H transfer electrode (the electrode of the first layer) is disposed on the transfer channel areas and the channel stop areas in parallel to the first horizontal charge-transfer part and the second horizontal charge-transfer part (see FIG. 8B).

Figure 8C:
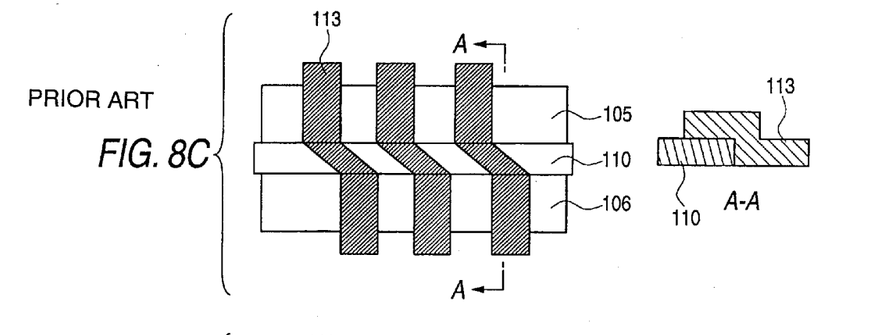
Figure 8D:
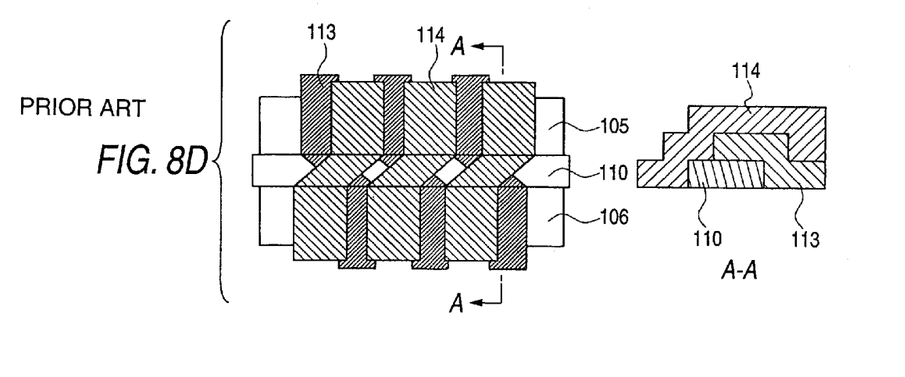

Next, although a horizontal transfer electrode common to the first horizontal charge-transfer part and the second horizontal charge-transfer part is formed, since the horizontal charge-transfer part generally includes a storage part and a transfer part, horizontal transfer electrodes of two layers are formed. Specifically, as shown in FIG. 8C, a horizontal transfer electrode 113 of a second layer is formed, and subsequently, as shown in FIG. 8D, a horizontal transfer electrode 114 of a third layer is formed.

By adopting the structure as stated above, an H-H transfer clock HHGφ is applied to the H-H electrode at a timing shown in FIG. 7 from the timing signal generation circuit, and the H-H transfer clock applied to the H-H electrode is applied to the transfer channel area, so that the H-H transfer is realized.

SUMMARY OF THE INVENTION

In the case where the structure as shown in FIGS. 8A to 8D is adopted in order to realize the H-H transfer, since the horizontal transfer electrodes (the second layer, the third layer) of the two layers are stacked over the H-H transfer electrode (first layer), a stepped part with a thickness of the three layers at the maximum is produced (for example, when each layer has about 600 nm, the stepped part with a thickness of about 1.8 μm at the maximum is produced), and the stepped part as stated above becomes a serious problem in process working.

As a specific example of disadvantages caused when the structure as shown in FIGS. 8A to 8D is adopted, for example, as a manufacturing method of the horizontal transfer electrode of the third layer, there is conceivable a method in which first, a conductive layer constituting the horizontal transfer electrode of the third layer is formed over the horizontal transfer electrode of the second layer, a photoresist is applied onto this conductive layer, and subsequently, after patterning of the photoresist is performed by using a lithography technique, the conductive layer is etched while the patterned photoresist is used as an etching mask. However, since there is a stepped part, there are conceivable disadvantages of (1) the focus height at the exposure is changed when the patterning of the photoresist is performed by the lithography technique, and the photoresist patterning with high precision can not be performed, and (2) when the conductive layer is etched while the patterned photoresist is used as the etching mask, an etching residual is generated.

Besides, although various layers are stacked on the horizontal transfer electrode of the third layer, since the stepped part exists, there is a fear that a bad influence is exerted on the formation of these layers.

Here, as a countermeasure against the disadvantages caused by the occurrence of the stepped part, film thinning of the H-H transfer electrode is conceivable. However, the resistance value of the H-H transfer electrode is increased by the film thinning of the H-H transfer electrode, the propagation delay of the H-H transfer clock applied from the end part of the H-H transfer electrode occurs, and the effective amplitude is lowered at the center of the H-H transfer electrode. When the effective amplitude is lowered at the center of the H-H transfer electrode, the efficiency of the H-H transfer is lowered, sufficient horizontal transfer can not be performed, and irregularity occurs between the end area of the H-H transfer electrode and the center area. Accordingly, the countermeasure of only the film thinning of the H-H transfer electrode is insufficient.

Thus, it is conceivable that in addition to the film thinning of the H-H transfer electrode, a parallel wiring with low resistance is newly formed in order to reduce the resistance of the H-H transfer electrode, and a so-called shunt structure is adopted. However, in the case of this countermeasure, a step of newly forming the parallel wiring is required, and it can be hardly said that this countermeasure is realistic.

The invention has been made in view of the above, and it is desirable to provide a solid-state imaging device in which film thinning of an H-H transfer electrode can be realized.

According to an embodiment of the present invention, a solid-state imaging device includes an imaging part, a first horizontal charge-transfer part and a second horizontal charge-transfer part that transfer charges transferred from the imaging part in a horizontal direction, an inter-horizontal charge-transfer part transfer electrode that applies a voltage to a transfer channel area provided between the first horizontal charge-transfer part and the second horizontal charge-transfer part, and a first light-shielding film that is provided over the first horizontal charge-transfer part and the second horizontal charge-transfer part and is made of a conductive material, and the inter-horizontal charge-transfer part transfer electrode and the first light-shielding film are electrically connected to each other.

Here, since the H-H transfer electrode and the first light-shielding film are electrically connected to each other, the first light-shielding film can be made to function as a shunt wiring, and the reduction in the resistance of the H-H transfer electrode is realized. The reduction in the resistance of the H-H transfer electrode enables the film thinning of the H-H transfer electrode.

That is, the first light-shielding film is made to function as the shunt wiring so that the resistance value of the H-H transfer electrode is sufficiently small, and therefore, the film thinning of the H-H transfer electrode becomes possible.

Besides, since the first light-shielding film is used as the shunt wiring, that is, since the first light-shielding film is made to function as both the light-shielding film and the shunt wiring, it is unnecessary to form a new shunt wiring, and the shunt structure can be realized without increasing the number of processes.

Besides, an electrically insulated gap is formed between the first light-shielding film and the second light-shielding film, so that the first light-shielding film and the second light-shielding film can be electrically insulated from each other, and therefore, even if the H-H transfer clock is applied to the first light-shielding film, the H-H transfer clock is not applied to the second light-shielding film positioned in the vicinity of the imaging part, and an bad influence exerted on the signal charge stored in the pixel can be suppressed.

That is, in the case where the first light-shielding film is made to function as the shunt wiring, the H-H transfer clock is applied to the first light-shielding film, and when the first light-shielding film and the second light-shielding film are electrically connected to each other, the H-H transfer clock is applied also to the second light-shielding film. Since the second light-shielding film is also the light-shielding film over the pixel in the optical black area, it is conceivable that a bad influence is exerted on the signal charge stored in the pixel. Then, the electrically insulated gap is formed between the first light-shielding film and the second light-shielding film, so that the H-H transfer clock is not applied to the second light-shielding film.

Further, since a third light-shielding film is formed at a position corresponding to the formation position of the gap between the first light-shielding film and the second light-shielding film, it is possible to suppress a light leakage from the gap between the first light-shielding film and the second light-shielding film.

Besides, since the H-H transfer electrode and the first light-shielding film are electrically connected to each other at the portion above the channel stop area provided between the transfer channel areas, it is possible to suppress the horizontal transfer degradation between the first horizontal charge-transfer part and the second horizontal charge-transfer part.

That is, it has been believed that in the case where the material (for example, aluminum) constituting the first light-shielding film and the material (for example, polysilicon) constituting the H-H transfer electrode are electrically connected to each other, since work functions of both are different from each other, a potential shift occurs (see reference material 1: Kazuya Yonemot, Shuji Abe, "HDTV Two Million Pixel FIT-CCD Image Sensor", The Institute of Electronics, Information and Communication Engineers, June, 1990, VLD90-22, ICD90-58). When the potential shift occurs, the potential at the connection point between the first light-shielding film and the H-H transfer electrode is irregularly changed, and significant horizontal transfer degradation between the first horizontal charge-transfer part and the second horizontal charge-transfer part is caused.

Accordingly, in order not to generate the potential shift at the portion above the transfer channel area which influences the H-H transfer, in other word, in order to generate the potential shift at the portion above the channel stop area which hardly influences the H-H transfer, the H-H transfer electrode and the first light-shielding film are electrically connected to each other at the portion above the channel stop area, so that the horizontal transfer degradation between the first horizontal charge-transfer part and the second horizontal charge-transfer part is suppressed.

Incidentally, the channel stop area to suppress the signal charge leakage between adjacent transfer channels in the H-H transfer inevitably exists, this channel stop area is generally formed by ion implanting a high concentration P-type impurity, and it is ideal that a ground potential is applied.

Accordingly, when the H-H transfer electrode and the first light-shielding film are electrically connected at the portion above the channel stop area, and the potential shift is generated at the portion above the channel stop area, the potential of the channel stop area, to which the ground potential is originally applied, can be made to more approach the ground potential, which is profitable and does not cause any problem.

In the solid-state imaging device according to the embodiment of the invention, the first light-shielding film is made to function as the shunt wiring so that reduction in the resistance of the H-H transfer electrode is realized, and therefore, film thinning of the H-H transfer electrode is realized.

Besides, even if the three-layer structure as shown in FIGS. 8A to 8D is adopted in order to realize the H-H transfer, the film thinning of the H-H transfer electrode is realized, and accordingly, the stepped part can be made small, and the disadvantage in the process working due to the stepped part can be removed.

DESCRIPTION OF PREFERRED INVENTION

Hereinafter, embodiments of the present invention will be described with reference to the drawings for understanding of the invention.

Figure 1:
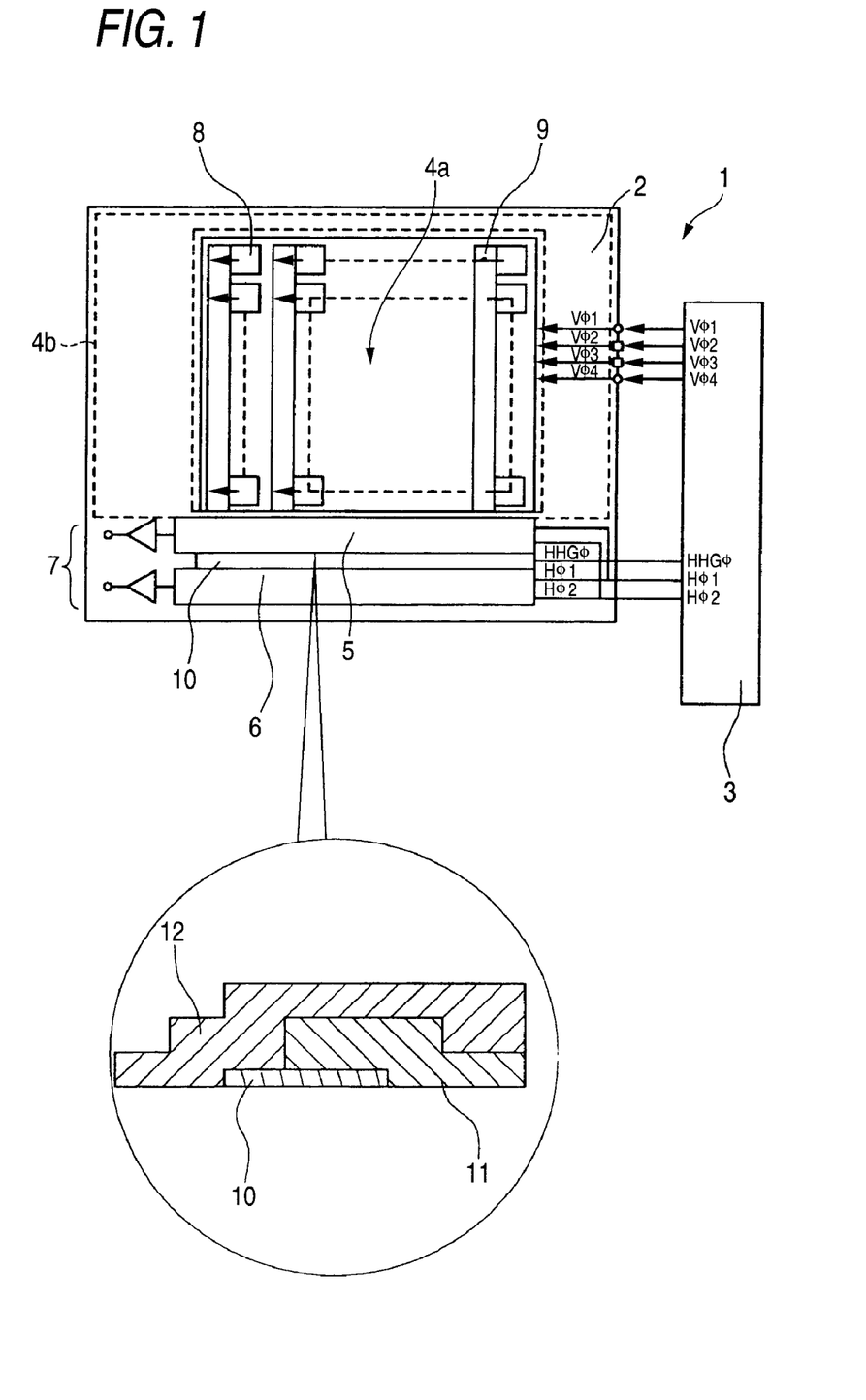
FIG. 1 is a schematic view for explaining a CCD solid-state imaging device according to an embodiment of the invention.
Figure 2A:
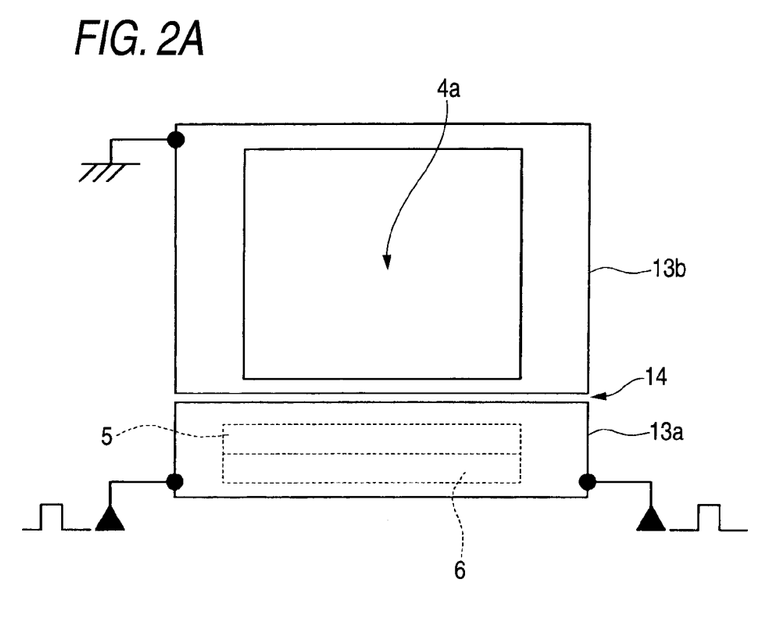
FIGS. 2A and 2B are schematic views for explaining a light-shielding film of the CCD solid-state imaging device according to the embodiment of the invention.
Figure 2B:
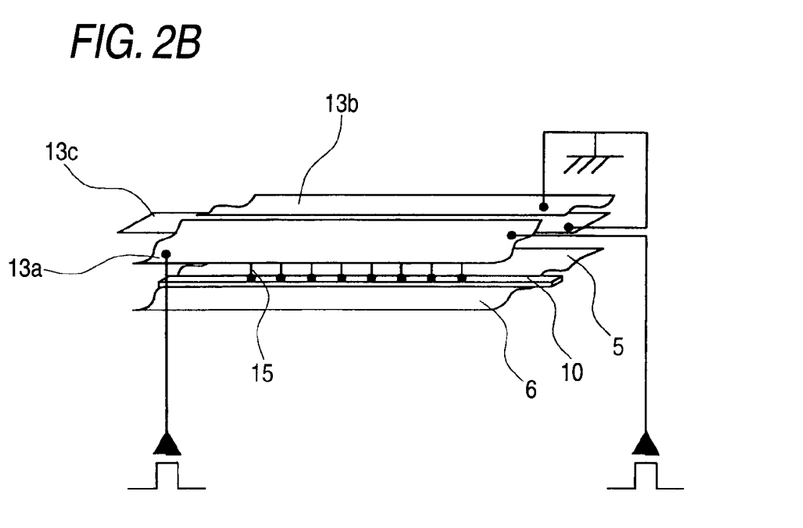

FIG. 1 is a schematic view for explaining a CCD solid-state imaging device as an example of a solid-state imaging device according to an embodiment of the invention, and FIGS. 2A and 2B (FIG. 2A is a schematic plan view, and FIG. 2B is a schematic perspective view) are schematic views for explaining light-shielding films (a first light-shielding film, a second light-shielding film, and a third light-shielding film) of the CCD solid-state imaging device as the example of the solid-state imaging device according to the embodiment of the invention. Incidentally, for convenience of illustration, in FIG. 2B, the illustration of a horizontal transfer electrode of a second layer, and a horizontal transfer electrode of a third layer are omitted.

Similarly to the solid-state imaging device in the related art, a CCD solid-state imaging device 1 shown in FIG. 1 includes a CCD solid-state imaging element 2 and a timing signal generation circuit 3, and the CCD solid-state imaging element roughly includes an imaging part 4a, an optical black area 4b, a first horizontal charge-transfer part 5, a second horizontal charge-transfer part 6, and an output part 7.

The imaging part includes light receiving parts 8 arranged in a matrix form, and a vertical charge-transfer part 9 which is provided for each of vertical columns of the respective light receiving parts and transfers charges from the respective light receiving parts.

Further, a transfer channel area 16a and a channel stop area 16b, which are formed by performing ion implantation, are formed between the first horizontal charge-transfer part and the second horizontal charge-transfer part. Besides, an H-H transfer electrode 10 (first layer) with a thickness of about 300 nm, a horizontal transfer electrode 11 of a second layer with a thickness of about 600 nm, and a horizontal transfer electrode 12 of a third layer with a thickness of about 600 nm are formed on the transfer channel area and the channel stop area.

A light-shielding film 13 made of aluminum, which shields the optical black area and shields the first horizontal charge-transfer part and the second horizontal charge-transfer part, is formed over the CCD solid-state imaging element, and a slit 14 is provided so that this light-shielding film is divided into a first light-shielding film 13a to shield the first horizontal charge-transfer part and the second horizontal charge-transfer part, and a second light-shielding film 13b to shield the optical black area. Further, a third light-shielding film 13c made of tungsten is formed at a position corresponding to the slit provided in the light-shielding film. Incidentally, the slit here is an example of a gap formed in order to electrically insulate the first light-shielding film from the second light-shielding film.

Figure 3:
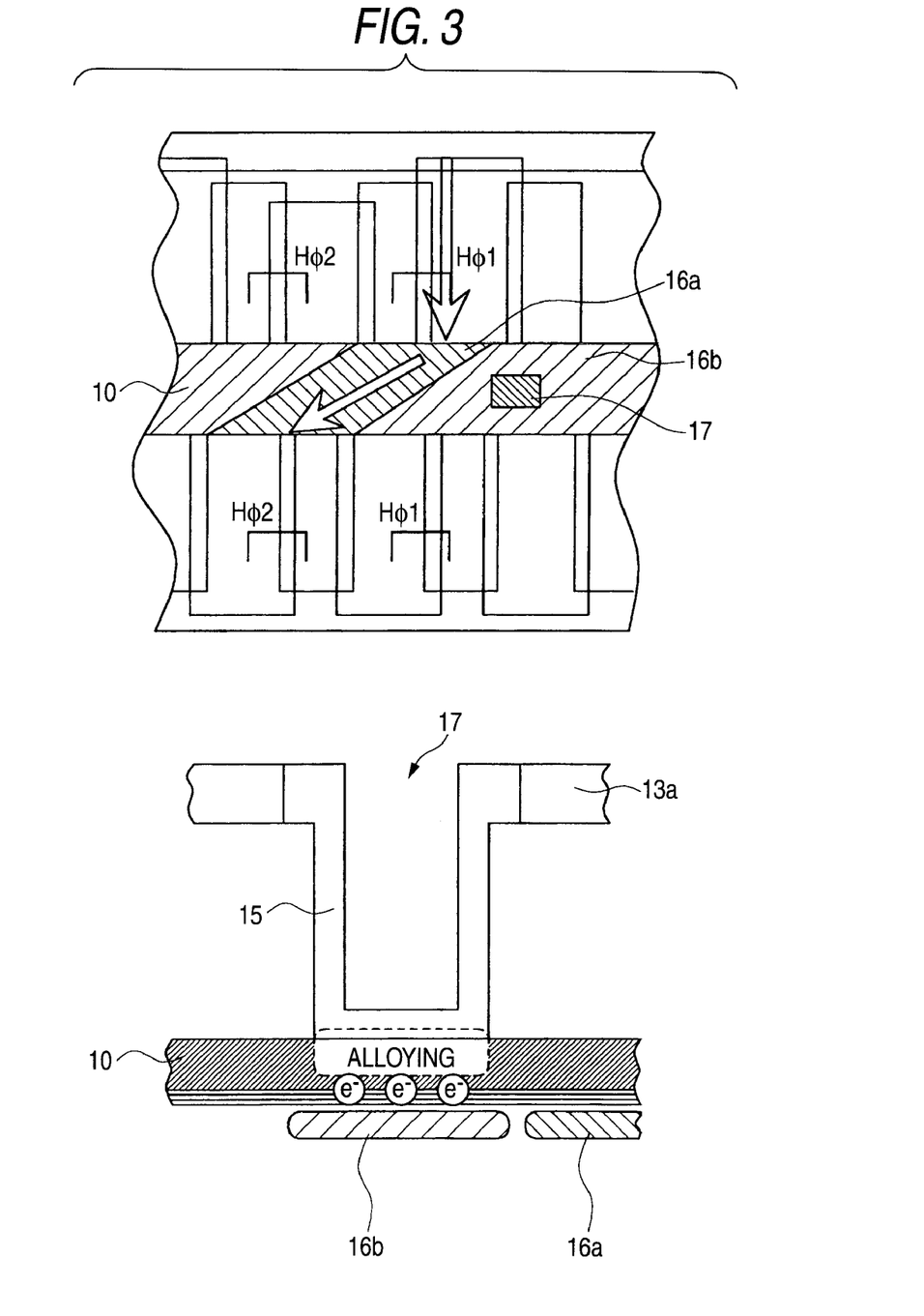
FIG. 3 is a schematic view for explaining electrical connection between an H-H transfer electrode and a first light-shielding film.

Besides, as shown in FIG. 3, a contact area 17 is provided in an area of the H-H transfer electrode positioned above the channel stop area, and this contact area and the first light-shielding film are electrically connected by an aluminum wiring 15 so that an H-H transfer clock is applied. The ground potential is applied to the second light-shielding film and the third light-shielding film.

Similarly to the solid-state imaging device in the related art, vertical transfer clocks $V\phi1$, $V\phi2$, $V\phi3$ and $V\phi4$ are applied to the vertical charge-transfer parts at timings shown in FIG. 7 from the timing signal generation circuit, so that charges read into the vertical charge-transfer parts from the light receiving parts are transferred in the vertical direction. An H-H transfer clock $HHG\phi$ is applied to the H-H transfer electrode and the first light-shielding film at a timing shown in FIG. 7 from the timing signal generation circuit, so that the charges transferred from the vertical charge-transfer parts to the first horizontal charge-transfer part are transferred to the second horizontal charge-transfer part. Horizontal transfer clocks $H\phi1$ and $H\phi2$ are applied to the first horizontal charge-transfer part and the second horizontal charge-transfer part at timings shown in FIG. 7 from the timing signal generation circuit, so that the charges are sequentially horizontally transferred from the first horizontal charge-transfer part and the second horizontal charge-transfer part to the output part and can be outputted from the output part.

In the CCD solid-state imaging device according to the embodiment of the invention, the first light-shielding film is made the shunt wiring so that the reduction in the resistance of the H-H transfer electrode is realized, and accordingly, it is conceivable that even if the H-H transfer electrode is made as thin as about 300 nm, a problem of propagation delay hardly occurs.

By the realization of the film thinning of the H-H transfer electrode, it is possible to remove the disadvantage in the process working due to the stepped part in the case where the three-layer structure (the H-H transfer electrode of the first layer, the horizontal transfer electrode of the second layer, and the horizontal transfer electrode of the third layer) is adopted in order to realize the H-H transfer.

Incidentally, since the already-existing first light-shielding film is used as the shunt wiring, the reduction in the resistance of the H-H transfer electrode can be realized without newly forming a shunt wiring.

Besides, in the CCD solid-state imaging device according to the embodiment of the invention, since the slit is formed in the light-shielding film to divide it into the first light-shielding film and the second light-shielding film, a bad influence exerted on a charge stored in a pixel can be suppressed. Hereinafter, this point will be described.

Figure 4A:
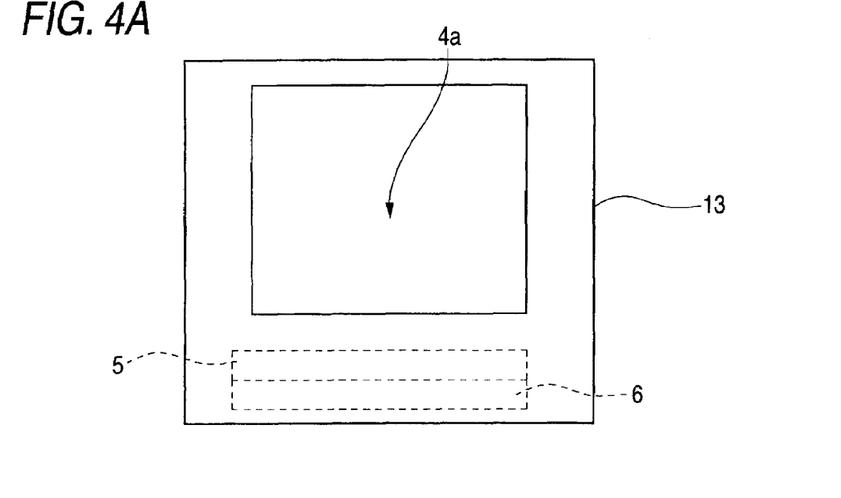
FIGS. 4A to 4C are schematic views for explaining formation of a slit in a light-shielding film.

First, in the solid-state imaging device of the related art, the slit is not formed in the light-shielding film, and the area (area corresponding to the first light-shielding film of this embodiment) to shield the first horizontal charge-transfer part and the second horizontal charge-transfer part and the area (corresponding to the second light-shielding film of this embodiment) to shield the optical black area are integrated (see FIG. 4A).

Figure 4B:
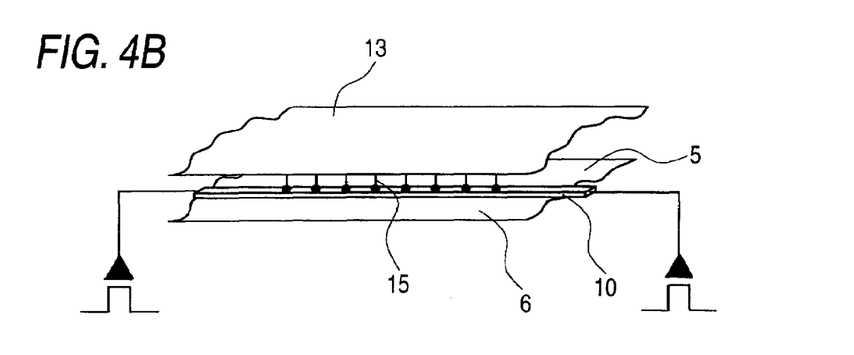

In the case where the light-shielding film is used as the shunt wiring, since it is necessary to electrically connect the H-H transfer electrode and the light-shielding film (see FIG. 4B), the H-H transfer clock applied to the H-H transfer electrode is applied also to the light-shielding film. When the H-H transfer clock is applied to the light-shielding film shielding the optical black area, there is a fear that an influence is exerted on the charge stored in the pixel.

Then, the structure is adopted in which the slit is formed in the light-shielding film to divide it into the first light-shielding film and the second light-shielding film, that is, the structure is adopted in which the first light-shielding film and the second light-shielding film are electrically separated from each other, the first light-shielding film and the H-H transfer electrode are electrically connected to cause the first light-shielding film to function as the shunt wiring, and the H-H transfer clock is not applied to the second light-shielding film even if the H-H transfer clock is applied to the first light-shielding film, and accordingly, a bad influence exerted on the charge stored in the pixel can be suppressed.

Incidentally, in order to suppress the influence exerted on the charge stored in the pixel even if only slightly, from the same reason why the ground potential is generally applied to the light-shielding film of the solid-state imaging device of the related art, the ground potential is applied also to the second light-shielding film of this embodiment.

Further, in the CCD solid-state imaging device according to the embodiment of the invention, since the third light-shielding film made of tungsten is formed at the position corresponding to the slit, the light leakage from the slit can be suppressed.

Figure 4C:
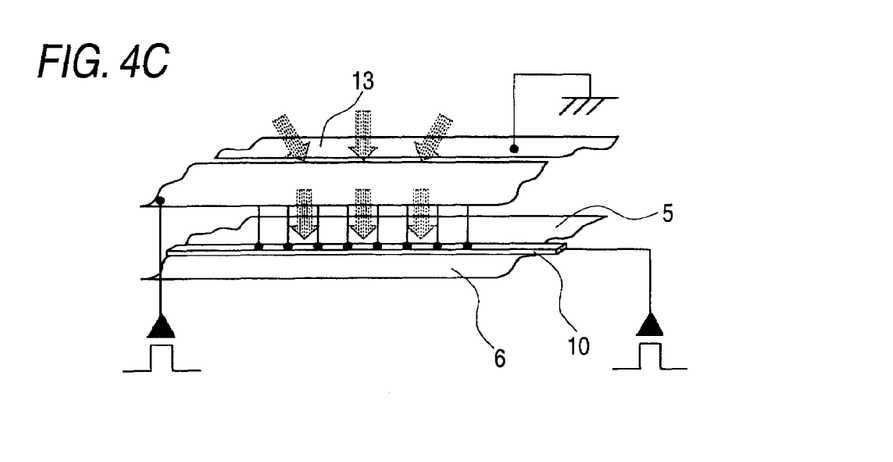

That is, in order to cause the light-shielding film to function as the shunt wiring, it is necessary to add the H-H transfer clock to the light-shielding film, and the slit is formed for that purpose. However, by the formation of the slit, there is a fear of the light leakage from the slit (see FIG. 4C). Then, the third light-shielding film made of tungsten is formed at the position corresponding to the slit, so that the light leakage from the slit can be suppressed.

Here, in the CCD solid-state imaging device according to the embodiment of the invention, although the third light-shielding film is formed below the light-shielding films (the first light-shielding film and the second light-shielding film), the third light-shielding film has only to suppress the light leakage from the slit, the film is not necessarily required to be formed below the light-shielding films (the first light-shielding film and the second light-shielding film), and the film may be formed above the light-shielding films (the first light-shielding film and the second light-shielding film). However, since a light-shielding film (not shown) made of tungsten for shielding the whole imaging part (the vertical charge-transfer part, inter-pixel parts, optical black area and the like are shielded, and an opening is provided for the light receiving part) is generally formed below the second light-shielding film to shield the optical black area. Thus, when consideration is given to the improvement of efficiency obtained by forming the third light-shielding film simultaneously with the formation of the light-shielding film to shield the vertical charge-transfer part, it is preferable that the third light-shielding film is formed below the light-shielding films (the first light-shielding film and the second light-shielding film), and the third light-shielding film is formed at the same time as the formation of the light-shielding film to shield the vertical charge-transfer part. Besides, it is further preferable that the third light-shielding film is formed by extending the light-shielding film to shield the whole imaging part.

Figure 5:
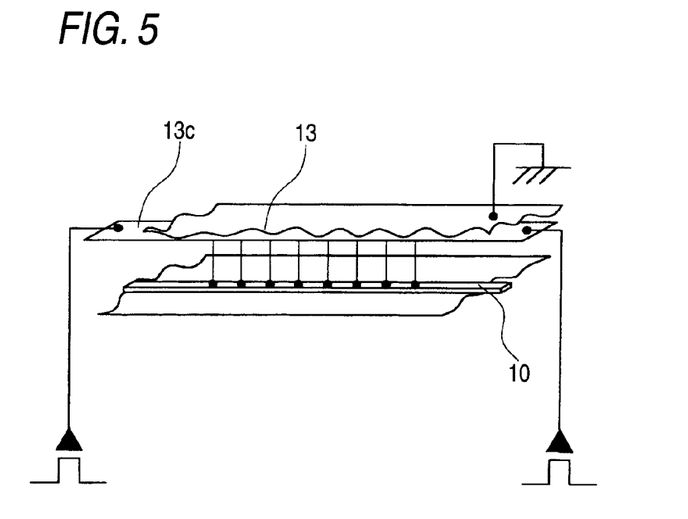
FIG. 5 is a schematic view for explaining a case where a tungsten film is used as a shunt wiring.

Incidentally, it is also conceivable that the tungsten film, which is formed simultaneously with the formation of the light-shielding film to shield the vertical charge-transfer part, is not used for shielding the light leakage from the slit, but is used as the shunt wiring in the first place. That is, the shunt structure can also be realized in such a manner that as shown in FIG. 5, similarly to the solid-state imaging device of the related art, the light-shielding film made of aluminum is placed in a state where the slit is not formed, a tungsten film 13c is formed below the light-shielding film 13 in the state where the slit is not formed, and this tungsten film is used as the shunt wiring.

However, with respect to the tungsten film formed simultaneously with the light-shielding film (tungsten film) of the vertical charge-transfer part, since an insulating film (several tens nm to about 100 nm) intervenes between the tungsten film and the H-H transfer electrode and both are very close to each other, the capacitances between the tungsten film and the first horizontal charge-transfer part and the second horizontal charge-transfer part are increased, and there is a fear that a bad influence is exerted on the horizontal transfer of the charge. Incidentally, in order to suppress an increase in dark current due to aluminum metal diffusion into the Si substrate, the light-shielding film of aluminum is provided to be spaced from an electrode, such as the H-H transfer electrode, close to the Si substrate by an insulating film with a thickness of several hundred nm to 1 μm serving also as a flattening film, the feared capacitance in the case of the tungsten film is structurally low (since the distance between the electrodes of the supposed capacitor is large). Accordingly, it can be hardly said that the method of using the tungsten film formed above the first horizontal charge-transfer part and the second horizontal charge-transfer part as the shunt wiring is appropriate.

Besides, in the CCD solid-state imaging device according to the embodiment of the invention, the contact area is provided in the area in the H-H transfer electrode positioned above the channel stop area, and this contact area and the first light-shielding film are electrically connected to each other through the aluminum wiring, and accordingly, the horizontal transfer degradation between the first horizontal charge-transfer part and the second horizontal charge-transfer part can be suppressed. Hereinafter, this point will be described.

That is, since there is a difference in working function between the first light-shielding film made of aluminum and the H-H transfer electrode made of polysilicon, the potential shift occurs as described above.

In case an area in the H-H transfer electrode positioned above the transfer channel area and the first light-shielding film are electrically connected to each other by an aluminum wiring, the potential is irregularly changed at the connection point, and there is a fear that the horizontal transfer degradation between the first horizontal charge-transfer part and the second horizontal charge-transfer part is caused. On the other hand, when the area in the H-H transfer electrode positioned above the channel stop area and the first light-shielding film are electrically connected to each other by the aluminum wiring, since the channel stop area is originally ion-implanted with a high concentration P-type impurity, and a ground potential, which is ideal, is applied, even if the potential shift occurs at the connection point, the action is merely such that the potential of the channel stop area, the ideal potential of which is originally the ground potential, is made to more approach the ground potential. Thus, it is conceivable that a bad influence is not exerted on the horizontal transfer between the first horizontal charge-transfer part and the second horizontal charge-transfer part.

Accordingly, by forming the environment in which the area in the H-H transfer electrode positioned above the channel stop area and the first light-shielding film are connected to each other by the aluminum wiring, and the potential shift does not occur at the portion above the transfer channel area, as stated above, the horizontal transfer degradation between the first horizontal charge-transfer part and the second horizontal charge-transfer part can be suppressed.

Incidentally, in the CCD solid-state imaging device according to the embodiment of the invention, the H-H transfer clock is applied to the first light-shielding film, and in view of the fact that the light-shielding film is grounded in the solid-state imaging device of the related art, there is a fear of a noise component by coupling to the horizontal charge-transfer part (the first horizontal charge-transfer part and the second horizontal charge-transfer part). However, since the H-H transfer electrode is driven only in the horizontal blanking period (corresponding to characters t1 to t9 in FIG. 7) where the horizontal charge-transfer parts (the first horizontal charge-transfer part and the second horizontal charge-transfer part) are not driven, that is, the H-H transfer clock is applied to the first light-shielding film only in the horizontal blanking period, and accordingly, it is conceivable that even if the H-H transfer clock is applied to the first light-shielding film, a bad influence is not exerted on the horizontal charge-transfer. Besides, the concepts of the terms, such as horizontal, H and vertical, are merely idiomatically used to differentiate among functions, and do not limit the directionality. For example, even if the CCD solid-state imaging device 2 of FIG. 1 is rotated on the plane by 90 degrees (that is, horizontal, H→vertical direction, vertical→horizontal, H), the effects according to the embodiment of the invention are not changed.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state imaging device comprising:
   an imaging part;
   a first horizontal charge-transfer part and a second horizontal charge-transfer part that transfer charges transferred from the imaging part in a horizontal direction;
   an inter-horizontal charge-transfer part transfer electrode that applies a voltage to a transfer channel area provided between the first horizontal charge-transfer part and the second horizontal charge-transfer part; and
   a first light-shielding film that is provided over the first horizontal charge-transfer part and the second horizontal charge-transfer part and is made of a conductive material,
   wherein the inter-horizontal charge-transfer part transfer electrode and the first light-shielding film are electrically connected to each other.

2. The solid-state imaging device according to claim 1, wherein an electrically insulated gap is formed between the first light-shielding film and a second light-shielding film provided over an optical black area positioned at a periphery of the imaging part.

3. The solid-state imaging device according to claim 2, wherein a third light-shielding film is formed at a position corresponding to a formation position of the gap.

4. The solid-state imaging device according to claim 1, wherein the inter-horizontal charge-transfer part transfer electrode and the first light-shielding film are electrically connected to each other at a portion above a channel stop area provided between the transfer channel areas.

* * * * *